(12) United States Patent
Cheng et al.

(10) Patent No.: US 11,871,560 B2
(45) Date of Patent: Jan. 9, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Mingxia Cheng, Hefei (CN); Yang Chen, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 319 days.

(21) Appl. No.: 17/468,469

(22) Filed: Sep. 7, 2021

(65) Prior Publication Data

US 2022/0216215 A1   Jul. 7, 2022

Related U.S. Application Data

(63) Continuation of application No. PCT/CN2021/106120, filed on Jul. 13, 2021.

(30) Foreign Application Priority Data

Jan. 4, 2021  (CN) .......................... 202110004912.6

(51) Int. Cl.
*H01L 27/108*   (2006.01)
*H10B 12/00*    (2023.01)
*G11C 5/06*     (2006.01)

(52) U.S. Cl.
CPC ........... *H10B 12/482* (2023.02); *G11C 5/063* (2013.01)

(58) Field of Classification Search
CPC .............................. H10B 12/482; G11C 5/063
See application file for complete search history.

(56) References Cited

U.S. PATENT DOCUMENTS

| 7,608,546 B2 | 10/2009 | Park |
| 7,666,796 B2 | 2/2010 | Ban |
| 9,449,821 B2 | 9/2016 | Yang et al. |
| 2008/0160653 A1 | 7/2008 | Park |
| 2016/0020211 A1* | 1/2016 | Yang .................. H01L 21/0276 438/704 |
| 2019/0172717 A1* | 6/2019 | Ko ...................... G03F 7/70033 |

FOREIGN PATENT DOCUMENTS

| CN | 101211754 A | 7/2008 |
| CN | 210272309 U | 4/2020 |
| KR | 20040057656 A | 7/2004 |

* cited by examiner

*Primary Examiner* — Mohammed R Alam
(74) *Attorney, Agent, or Firm* — Cooper Legal Group, LLC

(57) ABSTRACT

The application provides a method for manufacturing a semiconductor structure and the semiconductor structure, and relates to the technical field of semiconductors. The method for manufacturing the semiconductor structure includes: providing a base; sequentially stacking an initial conductive layer, an initial first dielectric layer, an initial first mask layer, an initial second dielectric layer, an initial second mask layer and a photoresist layer with a pattern on the base; and etching part of the initial second mask layer, part of the initial second dielectric layer and part of the initial first mask layer by taking the photoresist layer as a mask, so as to form a second dielectric layer with a trapezoidal structure which is of a structure with small top and large bottom.

15 Claims, 16 Drawing Sheets

METHOD FOR MANUFACTURING SEMICONDUCTOR STRUCTURE AND SEMICONDUCTOR STRUCTURE

CROSS-REFERENCE TO RELATED APPLICATIONS

The present application is a U.S. continuation application of International Application No. PCT/CN2021/106120, filed on Jul. 13, 2021, which claims priority to Chinese Patent Application No. 202110004912.6, filed on Jan. 4, 2021. International Application No. PCT/CN2021/106120 and Chinese Patent Application No. 202110004912.6 are incorporated herein by reference in their entireties.

TECHNICAL FIELD

The application relates to the technical field of memories, and in particular relates to a method for manufacturing a semiconductor structure and the semiconductor structure.

BACKGROUND

A dynamic random access memory (DRAM) is a semiconductor memory for randomly writing in and reading data at high speed, and is widely applied to a data storage apparatus or device.

The DRAM is composed of repetitive memory units. Each of the memory units usually includes a capacitive structure and a transistor. A gate of the transistor is connected with a word line, a drain of the transistor is connected with a bit line, and a source of the transistor is connected with the capacitive structure. Voltage signals on the word line controls the transistor to be switched on or switched off, so that data information stored in the capacitive structure is read through the bit line, or the data information is written into the capacitive structure through the bit line for storage.

With the development of the DRAM to miniaturization and integration, the distance between adjacent memory units is also reduced. However, in a manufacturing process of bit line structures of the DRAM, due to restrictions from an etching process and the performance of a material forming the bit line structures, the bit line structures are easily broken or bended, so that the yield of a semiconductor structure is influenced.

SUMMARY

In the first aspect, the embodiments of the application provide a method for manufacturing a semiconductor structure, which includes the following operations.

A base is provided.

An initial conductive layer, an initial first dielectric layer, an initial first mask layer, an initial second dielectric layer, an initial second mask layer and a photoresist layer with a pattern are sequentially stacked on the base.

Part of the initial second mask layer and part of the initial second dielectric layer are etched by taking the photoresist layer as a mask, so as to form a second dielectric layer with a trapezoidal structure. The width of the trapezoidal structure is gradually increased from an end departing from the base to an end close to the base.

Part of the initial first mask layer, part of the initial first dielectric layer, part of the initial conductive layer and part of the base are etched by taking the second dielectric layer as a mask, so as to form bit line structures.

In the second aspect, the embodiments of the application provide a semiconductor structure which includes a semiconductor structure formed by any one of the above methods.

Besides the above described technical problems solved by the embodiments of the application, technical features constituting the technical solutions and beneficial effects resulted from the technical features of these technical solutions, other technical problems solved by a method for manufacturing a memory and the memory provided by the embodiments of the application, other technical features included in the technical solutions and beneficial effects of these technical features will be further described in detail in specific implementation modes.

BRIEF DESCRIPTION OF THE DRAWINGS

In order to describe the technical solutions in the embodiments of the application or the related art more clearly, the drawings used in descriptions about the embodiments or the related art will be simply introduced below. It is apparent that the drawings described below are only some embodiments of the application. Others may further be obtained by those of ordinary skilled in the art according to these drawings without creative work.

DETAILED DESCRIPTION

Figure 1:
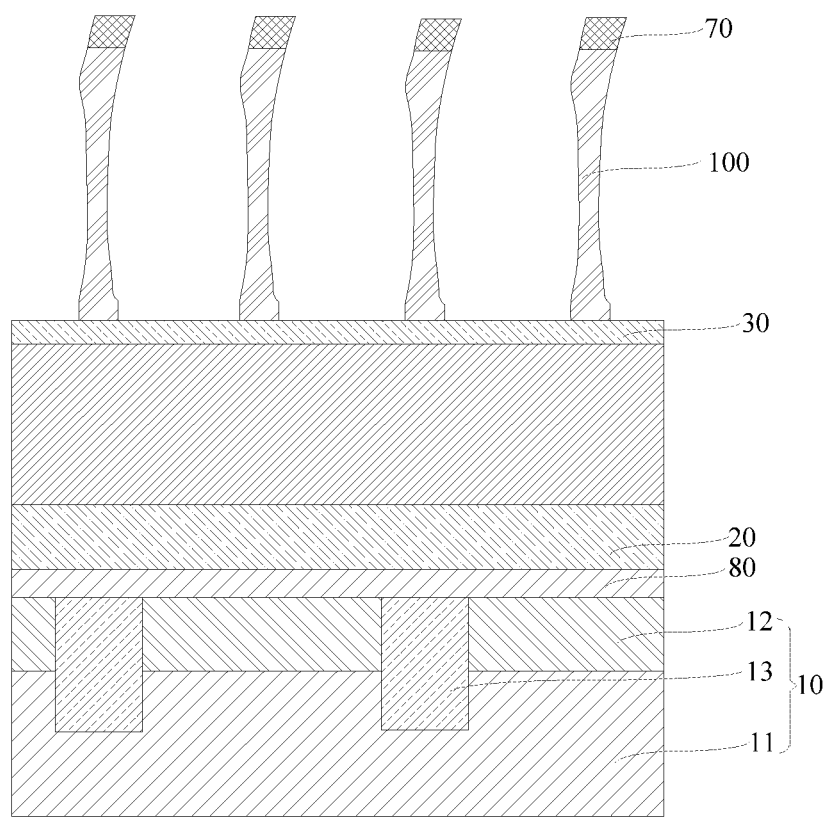
FIG. 1 is a first stage diagram of a method for manufacturing a semiconductor structure in the related art.
Figure 2:
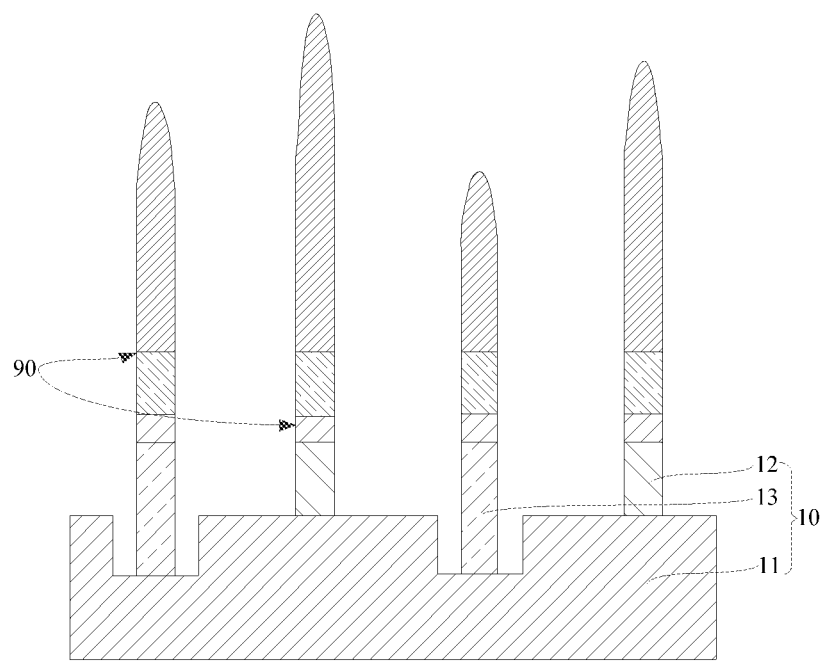
FIG. 2 is a second stage diagram of a method for manufacturing a semiconductor structure in the related art.
Figure 3:
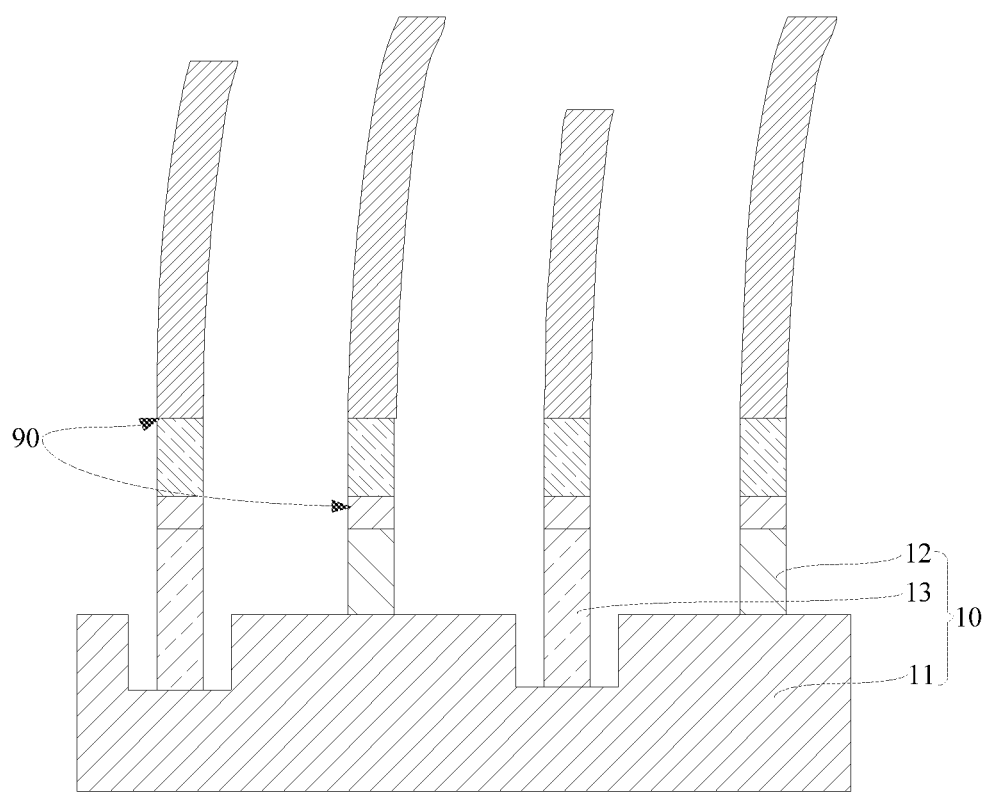
FIG. 3 is a third stage diagram of a method for manufacturing a semiconductor structure in the related art.

In an existing process for manufacturing bit line structures, as shown in FIG. 1, FIG. 2 and FIG. 3, an initial first dielectric layer 30 and an initial conductive layer 20 need to be etched by utilizing a mask layer 100, so as to form bit line structures 90 arranged at intervals on a base 10. However, with the development of a DRAM to miniaturization and integration, the distance between adjacent memory units is also reduced, so that the size of the bit line structures 90 is also increasingly smaller. At the moment, a carbon layer is generally selected to serve as the mask layer 100 to define the size of the bit line structures 90; this is because a carbon layer material is easy to be etched and define desired size. However, as the carbon material is soft, in a process for forming the mask layer 100 with a high depth-to-width ratio, the mask layer 100 is easily bended, so that the bit line structures 90 formed by taking the mask layer 100 as a mask have defects of easy breakage or bending and the like, and the yield of a semiconductor structure is decreased.

To solve the above technical problems, in the method for manufacturing the semiconductor structure and the semiconductor structure provided by the embodiments of the application, a second dielectric layer forms a trapezoidal structure with small top and large bottom, the structural strength of the second dielectric layer is increased, the second dielectric layer is prevented from being inclined or bended in an etching process, so that the bit line structures are prevented from being inclined or bended in a process of forming the bit line structures by taking the second dielectric layer as a mask, and thus the yield of the semiconductor structure is improved.

In order to make the above objectives, features and advantages of the embodiments of the application more apparent and understandable, the technical solutions in the embodiments of the application will be clearly and completely described below in combination with the drawings in the embodiments of the application. It is apparent that the described embodiments are not all embodiments but merely part of embodiments of the application. On the basis of the embodiments of the application, all other embodiments obtained by those of ordinary skilled in the art without creative work shall fall within the scope of protection of the application.

Figure 4:
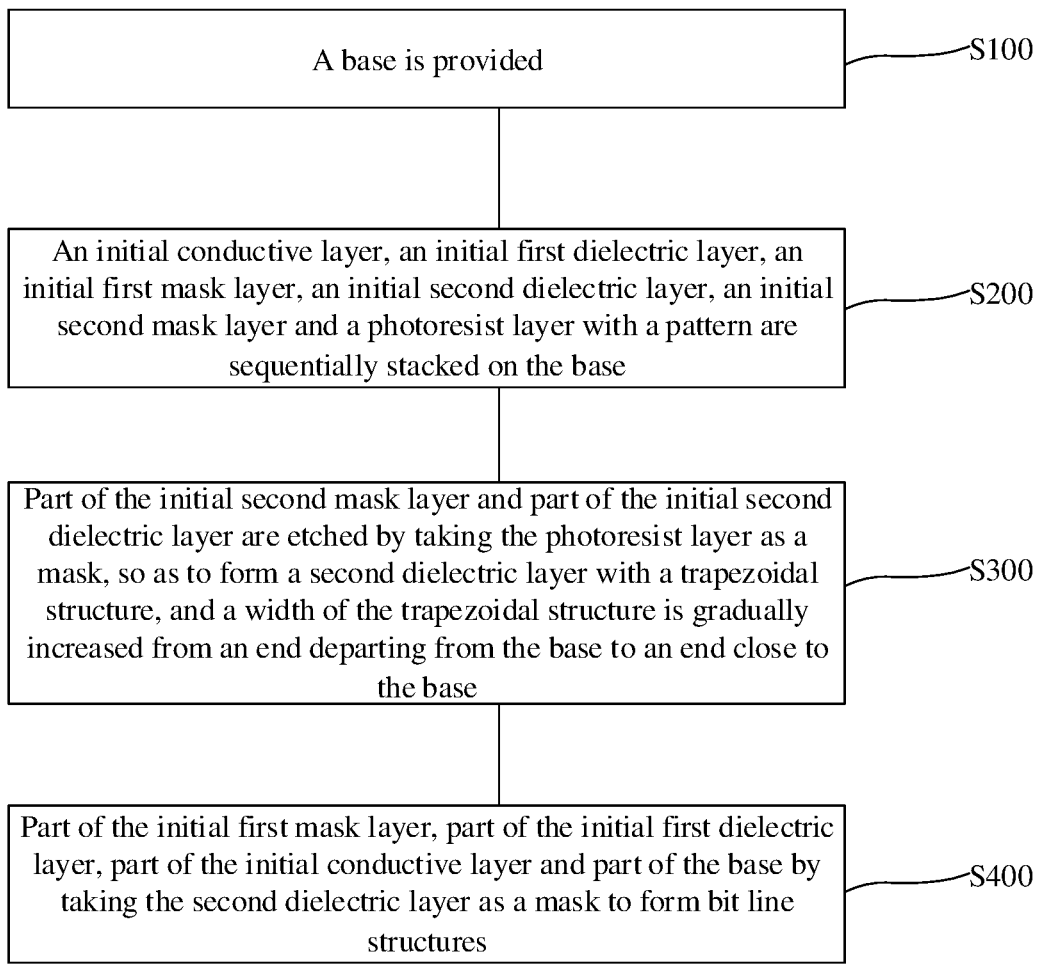
FIG. 4 is a flowchart of a method for manufacturing a semiconductor structure according to an embodiment of the application.

FIG. 4 is a flowchart of a method for manufacturing a semiconductor structure provided by the embodiments of the application; FIG. 5 to FIG. 16 are schematic structural diagrams of various stages of the method for manufacturing the semiconductor structure. The method for manufacturing the semiconductor structure is described below in combination with FIG. 5 to FIG. 16.

This embodiment does not limit the semiconductor structure. Description will be made by taking a DRAM as an example of the semiconductor structure. However, the embodiment is not limited to this, and the semiconductor structure in the embodiment may also be other structures.

As shown in FIG. 4, the embodiments of the application provide a method for manufacturing a semiconductor structure, which includes the following operations.

At S100, a base is provided.

Figure 5:
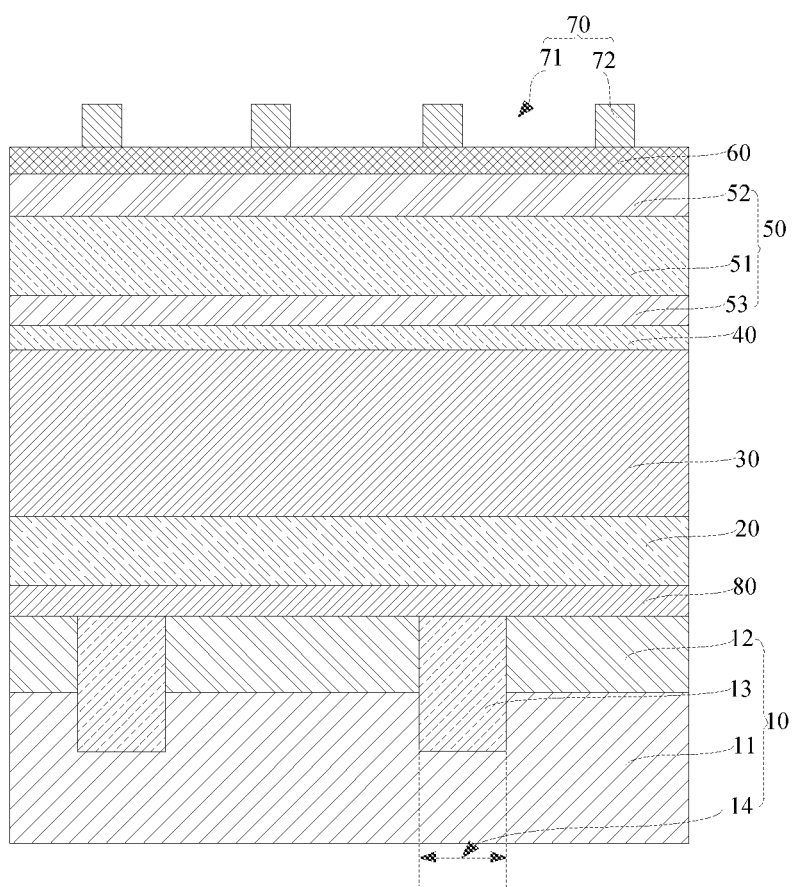
FIG. 5 is a schematic structural diagram with an initial conductive layer, an initial first dielectric layer, an initial first mask layer, an initial second dielectric layer, an initial second mask layer and a photoresist layer with a pattern formed in a method for manufacturing a semiconductor structure according to an embodiment of the application.

Exemplarily, referring to FIG. 5, a base 10 is used as a supporting part of the semiconductor structure and configured to support other parts arranged thereon. The base 10 may include a substrate 11 and an insulating layer 12 arranged on the substrate 11. The substrate 11 may be made of a semiconductor material, and the semiconductor material may be at least one of silicon, germanium, a silicon germanium compound or a silicon carbon compound.

First polycrystalline silicon layers 13 are arranged in the insulating layer 12. The first polycrystalline silicon layers 13 are arranged in the insulating layer 12 at intervals. The first polycrystalline silicon layers 13 extend into the substrate 11, and are configured to be electrically connected with active areas 14 in the substrate 11.

In the embodiment, the material of the insulating layer 12 may be silicon nitride. By utilizing the insulating layer 12, first polycrystalline silicon layers 13 are arranged in an insulation manner, the first polycrystalline silicon layers 13 and other conductive parts in the semiconductor structure may also be arranged in an insulation manner.

Moreover, when the first polycrystalline silicon layer 13 is manufactured, ions are required to be doped into the first polycrystalline silicon layers 13 through an ion implantation technology, so that the first polycrystalline silicon layers 13 has electric conductivity. The doped ions may be phosphonium ions or nitrogen ions.

At S200, an initial conductive layer, an initial first dielectric layer, an initial first mask layer, an initial second dielectric layer, an initial second mask layer and a photoresist layer with a pattern are sequentially stacked on the base.

In this operation, the above layers may be deposited on the base 10 through an atomic layer deposition process or a chemical vapor deposition process, that is, the layers are formed on the insulating layer 12 through the atomic layer deposition process or the chemical vapor deposition process.

It is to be noted that, in the embodiment, the initial conductive layer 20, the initial first dielectric layer 30, the initial first mask layer 40, the initial second dielectric layer 50 and the initial second mask layer 60 each may be a single layer, and may also be a composite layer, which is not specifically limited by the embodiment here.

Moreover, in the embodiment, the initial conductive layer 20 may be understood as a whole surface formed on the base 10 through the atomic layer deposition process or the chemical vapor deposition process and before being etched. Similarly, the conceptions of the initial first dielectric layer 30, the initial first mask layer 40, the initial second dielectric layer 50 and the initial second mask layer 60 are the same as the conception of the initial conductive layer 20, which is not specifically limited by the embodiment here.

A process of forming the photoresist layer 70 with the pattern may be conducted in the following operations. For example, the photoresist layer 70 with a certain thickness is formed on the initial second mask layer 60 through the atomic layer deposition process or the chemical vapor deposition process, and then, the photoresist layer 70 is subjected to patterned treatment through manners of masking, exposing, developing or etching and the like, so that the pattern is formed on the photoresist layer 70. Specifically, the pattern may include opening areas 71 and a shielding area 72 configured to separate the various opening areas 71.

In some embodiments, in order to prevent a conductive material in the initial conductive layer 20 from permeating into the base 10, an initial bit line blocking layer 80 may be formed on the base 10. That is, as shown in FIG. 5, the initial bit line blocking layer 80 is formed on the insulating layer 12. The initial bit line blocking layer 80 is configured to block the conductive material in the initial conductive layer 20 from permeating into the base 10, so that the electric conductivity of the bit line structures is ensured, and thus the yield of the semiconductor structure is improved.

Exemplarily, the material of the initial bit line blocking layer 80 may include conductive materials, such as titanium nitride, so that the initial conductive layer 20 electric connects with the active areas 14 of the base 10 while permeation between the initial conductive layer 20 and the base 10 is prevented.

At S300, part of the initial second mask layer and part of the initial second dielectric layer are etched by taking the photoresist layer as a mask, so as to form a second dielectric layer with a trapezoidal structure, and the width of the trapezoidal structure is gradually increased from an end departing from the base to an end close to the base.

It is to be noted that, part of the initial second dielectric layer is removed, and the retained initial second dielectric layer is called as a second dielectric layer. Similarly, way, the conception of the second mask layer is the same as the conception of the second dielectric layer.

Figure 6:
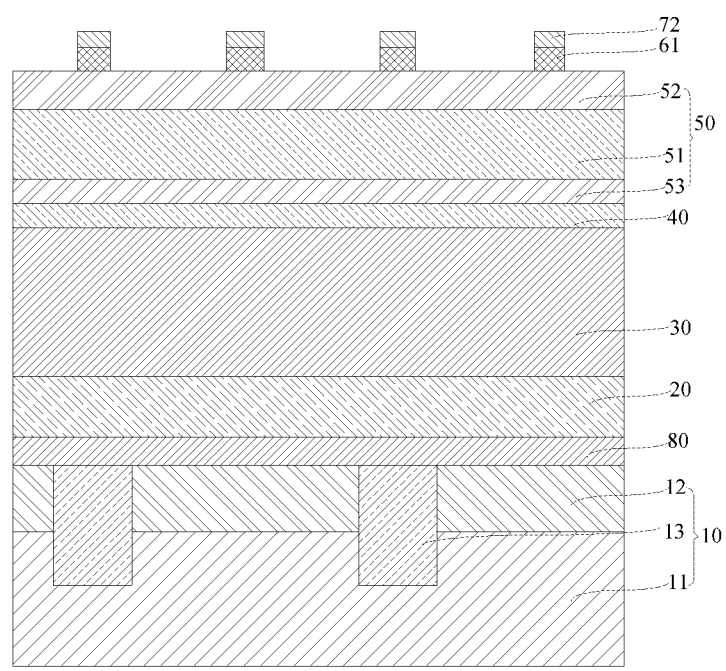
FIG. 6 is a schematic structural diagram with an initial second mask layer etched in a method for manufacturing a semiconductor structure according to an embodiment of the application.
Figure 7:
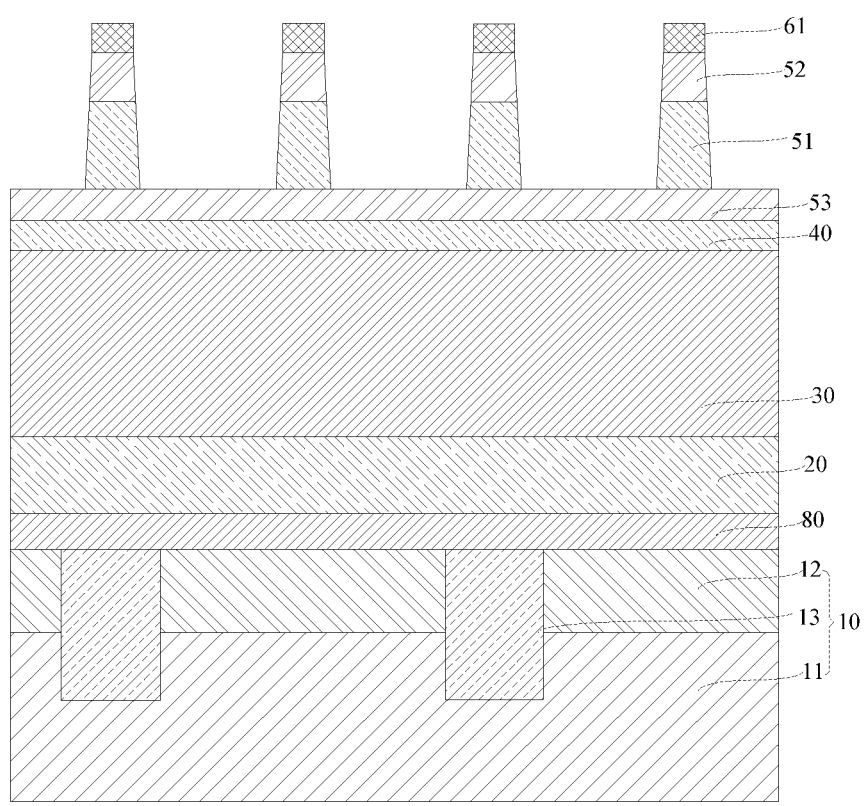
FIG. 7 is a first schematic structural diagram with an initial second dielectric layer etched in a method for manufacturing a semiconductor structure according to an embodiment of the application.
Figure 8:
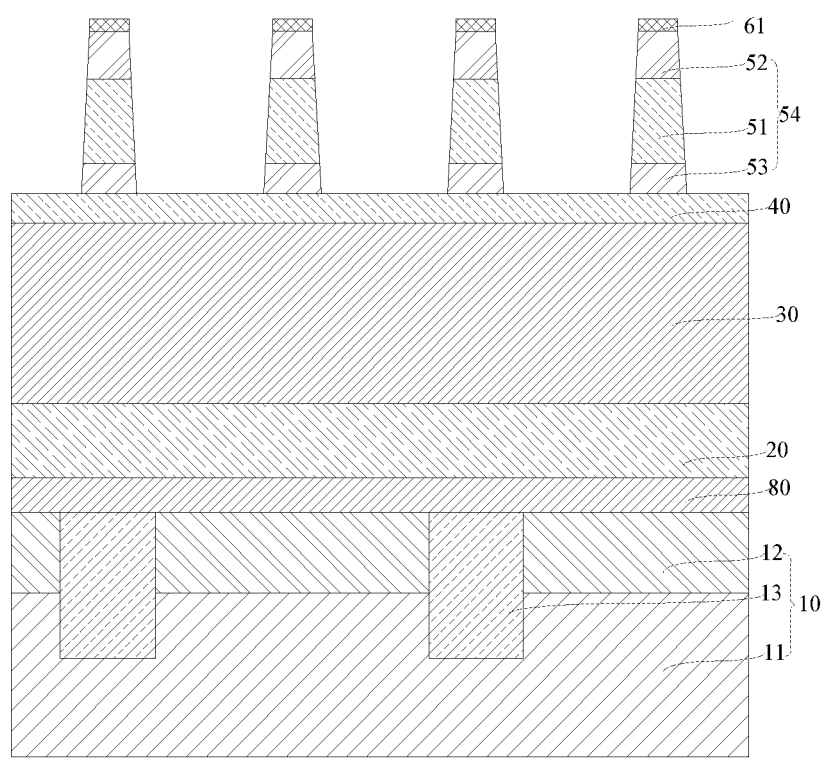
FIG. 8 is a second schematic structural diagram with an initial second dielectric layer etched in a method for manufacturing a semiconductor structure according to an embodiment of the application.

As shown in FIG. 6 to FIG. 8, the initial second mask layer 60 and the initial second dielectric layer 50 located at the opening area 71 are etched by utilizing dry etching, so as to retain the initial second mask layer 60 and the initial second dielectric layer 50 which are located below the shielding area 72, so that the retained initial second mask layer 60 forms a second mask layer 61, and the retained initial second dielectric layer 50 forms a second dielectric layer 54. The second dielectric layer 54 has a trapezoidal structure with small top and large bottom.

Exemplarily, as shown in FIG. 6, part of the initial second mask layer 60 is etched by taking the photoresist layer 70 as a mask, so as to form the second mask layer 61 with a pattern.

That is, the initial second mask layer 60 located at the opening area 71 is etched away by utilizing an etching liquid or an etching gas, so as to retain the initial second mask layer 60 located under the shielding area 72, and thus the initial second mask layer 60 forms second mask layers 61 arranged at intervals. The material of the initial second mask layer 60 may be silicon nitride.

However, as shown in FIG. 7 and FIG. 8, the photoresist layer 70 is removed. Part of the initial second dielectric layer 50 is etched by taking the second mask layer 61 as a mask, so as to form the second dielectric layer 54 with a trapezoidal structure.

Specifically, the photoresist layer 70 located on the second mask layer 61 is removed by washing, then the initial second dielectric layer 50, which is not shielded by the second mask layer 61, is etched away by utilizing an etching liquid or an etching gas, the retained initial second dielectric layer 50 forms the second dielectric layer 54 with the trapezoidal structure. The width of the trapezoidal structure is gradually increased from one end departing from the base 10 to an end close to the base 10. That is, the trapezoidal structure is a regular trapezoid with small top and large bottom.

In the embodiment, the initial second dielectric layer 50 may be a stacked structure. For example, the initial second dielectric layer 50 may include a second polycrystalline silicon layer 53, a first carbon layer 51 and a second carbon layer 52 sequentially formed on the initial first mask layer 40. The concentration of silicon ions in the second carbon layer 52, the first carbon layer 51 and the second polycrystalline silicon layer 53 are sequentially increased. In the embodiment of the application, the concentration of the silicon ions in the first carbon layer 51 is higher than the concentration of the silicon ions in the second carbon layer 52, so that the hardness of the first carbon layer 51 is greater than the hardness of the second carbon layer 52. Under the same etching condition, the etching amount of the first carbon layer 51 is less than the etching amount of the second carbon layer 52, so that the shape of the second dielectric layer 54 formed after etching the initial second dielectric layer 50 is a trapezoidal structure with small top and large bottom. By doing so, the second dielectric layer 54 is prevented from being inclined or bended, and thus, the subsequently formed bit line structures 90 will also not be bended or inclined.

The first carbon layer 51 is formed on the second polycrystalline silicon layer 53, which may be conducted in the following operations.

The initial first carbon layer with a certain thickness may be deposited on the second polycrystalline silicon layer 53 through the chemical vapor deposition process, and then, silicon ions are implanted into the initial first carbon layer through the ion implantation technology, so as to increase the concentration of the silicon ions in the initial first carbon layer to form the first carbon layer 51.

It is to be noted that, the ion implantation process is not conducted in the second polycrystalline silicon layer 53 in the embodiment. The second polycrystalline silicon layer 53 only serves as a normal mask layer.

Exemplarily, the process that part of the initial second dielectric layer 50 is etched by taking the second mask layer 61 as a mask to form the second dielectric layer 54 with the trapezoidal structure may be conducted in the following operations.

As shown in FIG. 7, part of the second carbon layer 52 and part of the first carbon layer 51 are etched by taking the second mask layer 61 as the mask, so as to form the second carbon layer 52 with a trapezoidal structure and the first carbon layer 51 with a trapezoidal structure.

As shown in FIG. 8, part of the second polycrystalline silicon layer 53 is etched by taking the second carbon layer 52 with the trapezoidal structure and the first carbon layer 51 with the trapezoidal structure as a mask, so as to form the second polycrystalline silicon layer 53 with a trapezoidal structure. The second dielectric layer 54 with a trapezoidal structure is formed by the second carbon layer 52 with the trapezoidal structure, the first carbon layer 51 with the trapezoidal structure and the second polycrystalline silicon layer 53 with the trapezoidal structure.

In the above operations, as the formed second dielectric layer 54 has the trapezoidal structure and the width of the trapezoidal structure is sequentially increased from top to bottom, the formed first mask layer 41 also has a trapezoidal structure with small top and large bottom, so that the structural strength of the second dielectric layer 54 and the first mask layer 41 is increased, the second dielectric layer 54 and the first mask layer 41 are prevented from being inclined or bended. Therefore, in a process of forming the bit line structures 90 by taking the second dielectric layer 54 and the first mask layer 41 as a mask, the bit line structures 90 are prevented from being inclined or bended, and thus the yield of the semiconductor structure is improved.

With the development of a semiconductor structure to integration and miniaturization, the spacing between devices in a semiconductor structure is getting smaller and smaller. In order to adapt to the small size of the semiconductor structure, the embodiment of the application may also adopt the following operations to reduce the key size of the bit line structure.

Exemplarily, after the second dielectric layer 54 with the trapezoidal structure is formed and before the second dielectric layer 54 is taken as a mask, the method for manufacturing the semiconductor structure may also include the following operations.

Figure 9:
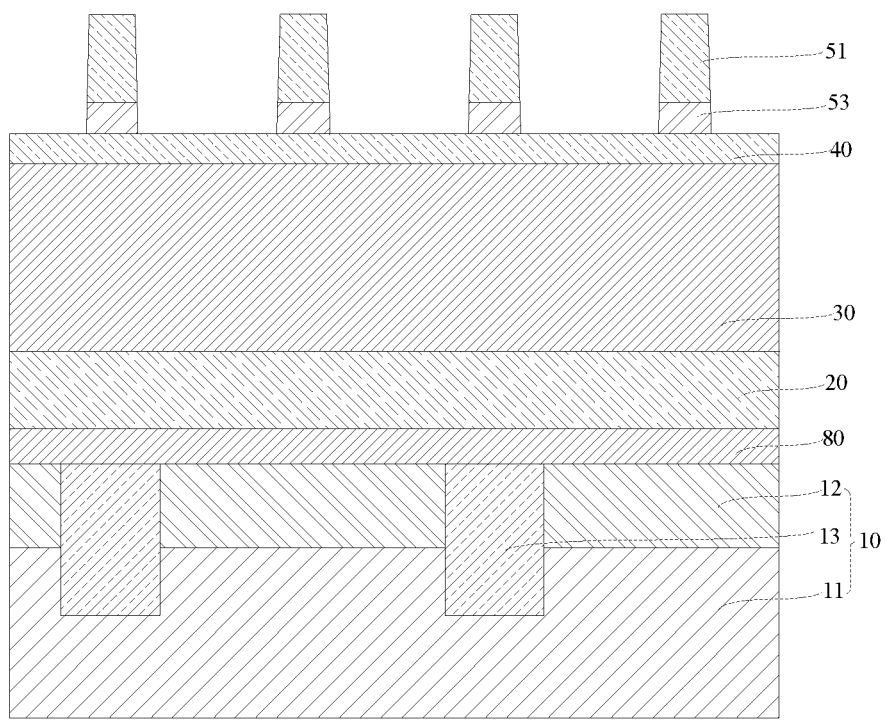
FIG. 9 is a schematic structural diagram with a first carbon layer and a second polycrystalline silicon layer corrected in a method for manufacturing a semiconductor structure according to an embodiment of the application.

As shown in FIG. 9, the second mask layer 61 and the second carbon layer 52 are removed. In this operation, the second mask layer 61 and the second carbon layer 52 may be removed through washing or etching.

The first carbon layer 51 with the trapezoidal structure and the second polycrystalline silicon layer 53 with the trapezoidal structure are corrected, so as to reduce the width of the first carbon layer 51 and the width of the second polycrystalline silicon layer 53.

The operation that the first carbon layer 51 with the trapezoidal structure and the second polycrystalline silicon layer 53 with the trapezoidal structure are corrected may be conducted in the following operations.

The first carbon layer 51 with the trapezoidal structure is corrected, so as to reduce the width of the first carbon layer 51.

Part of the second polycrystalline silicon layer 53 is corrected by taking the corrected first carbon layer 51 as a mask. The width of the retained second polycrystalline silicon layer 53 is decreased in comparison with the width of the second polycrystalline silicon layer 53 formed by taking the uncorrected first carbon layer 51 as a mask.

Specifically, in the embodiment, the first carbon layer 51 with the trapezoidal structure and the second polycrystalline silicon layer 53 with the trapezoidal structure are corrected through a dry etching process. For example, the first carbon layer 51 with the trapezoidal structure and the second polycrystalline silicon layer 53 with the trapezoidal structure are slightly etched by utilizing any one or more gases of NF3, CF4 and SF6, so that a correction effect is achieved. It is guaranteed that the size of the bit line structures 90 formed in a subsequent process becomes small which is benefit for the miniaturization of a semiconductor structure.

At S400, schematic diagrams of various stages in the operation that part of the initial first mask layer, part of the initial first dielectric layer, part of the initial conductive layer and part of the base are etched by taking the second dielectric layer as a mask to form the bit line structures are as shown in FIG. 10 to FIG. 16.

Figure 10:
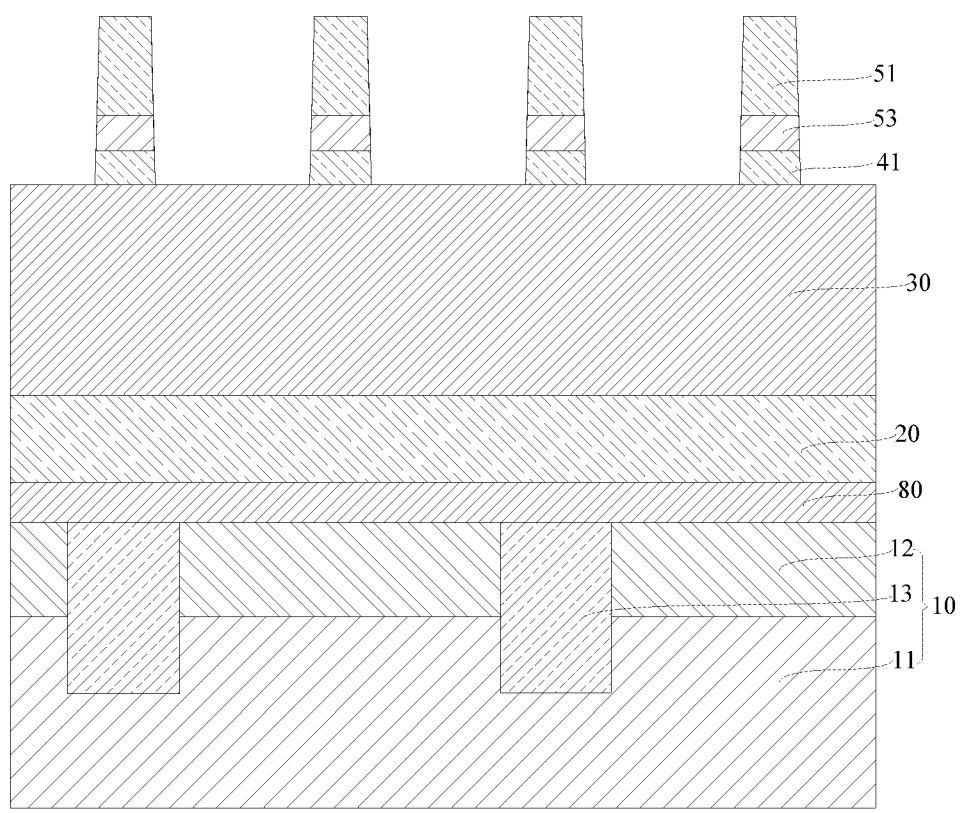
FIG. 10 is a schematic structural diagram with part of an initial first mask layer etched in a method for manufacturing a semiconductor structure according to an embodiment of the application.

Exemplarily, as shown in FIG. 10, part of the initial first mask layer 40 is etched by taking the corrected second polycrystalline silicon layer 53 as a mask, so as to form the first mask layer 41 with a trapezoidal structure.

That is, the initial first mask layer 40, which is not shielded by the second polycrystalline silicon layer 53, is etched away by utilizing an etching liquid or an etching gas, the retained initial first mask layer 40 forms the first mask layer 41 with the trapezoidal structure. The trapezoidal structure is a regular trapezoid with small top and large bottom.

In the embodiment, the initial first mask layer 40 may be a single layer, and may also be a composite layer. For example, when the initial first mask layer 40 is a single layer, the material of the initial first mask layer 40 is silicon oxide.

In the embodiment, the etching selection ratio between the first mask layer 41 and the second carbon layer 52 is also defined. For example, the etching selection ratio between the first mask layer 41 and the second carbon layer 52 is 1:15 to 1:9. Preferably, the etching selection ratio between the first mask layer 41 and the second carbon layer 52 is 1:10. The initial first mask layer 40 having a relatively small etching rate is arranged between the initial first dielectric layer 30 and the initial second dielectric layer 50, and is used as an etching stop layer. By doing so, the initial conductive layer 20 is prevented from being excessively etched, so that the electric conductivity of the bit line structures 90 is ensured.

Figure 11:
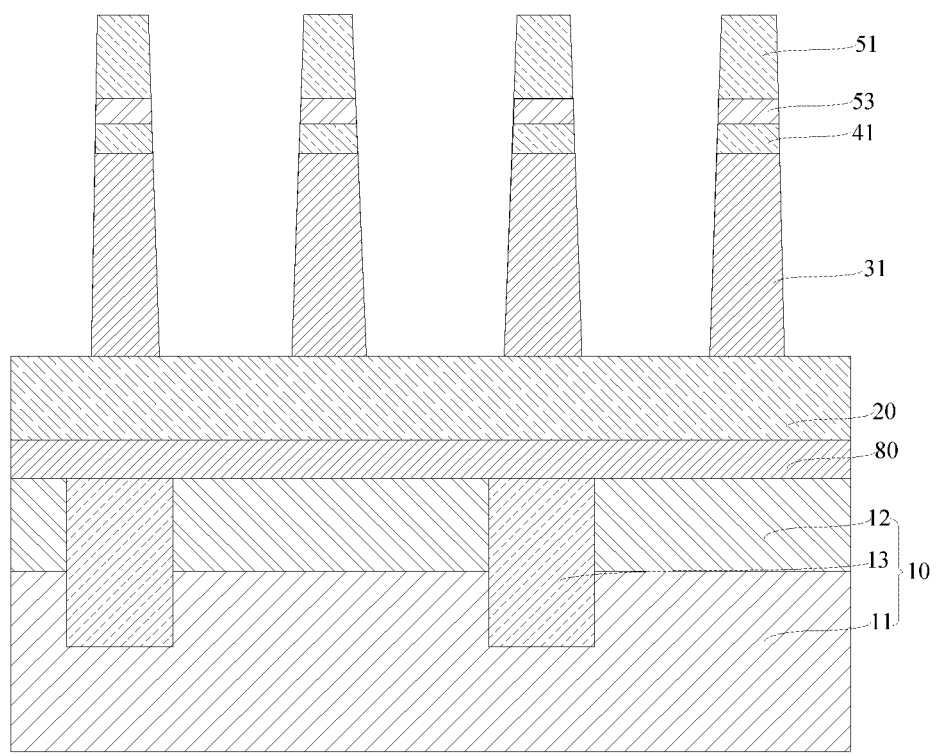
FIG. 11 is a schematic structural diagram with part of an initial first dielectric layer etched in a method for manufacturing a semiconductor structure according to an embodiment of the application.

As shown in FIG. 11, part of the initial first dielectric layer 30 is etched by taking the first mask layer 41 with the trapezoidal structure, so as to form a first dielectric layer 31 with a trapezoidal structure. That is, the initial first dielectric layer 30, which is not shielded by the first mask layer 41, is etched away by utilizing an etching liquid or an etching gas. Because the thickness of the initial first dielectric layer 30 is too thick and is 80-200 nm, in the downward etching process, with the etching gas at the lower portion of the initial first dielectric layer 30 is gradually decreased, less and less initial first dielectric layer 30 is etched, the retained initial first dielectric layer 30 forms the first dielectric layer 31 with a trapezoidal structure which is also a regular trapezoid with small top and large bottom.

In the embodiment, the initial first dielectric layer 30 may be a single layer. For example, the material of the initial first dielectric layer 30 may be silicon nitride. Specifically, the initial first dielectric layer 30 with a certain thickness may be sequentially deposited on the initial conductive layer 20 through the atomic layer deposition process or the chemical vapor deposition process. By utilizing the initial first dielectric layer 3, the initial conductive layer 20 is arranged with other parts of the semiconductor structure in an insulating arrangement, and is protected from being oxidized. The initial conductive layer 20 may include conductive materials, such as metal tungsten, configured to realize the electric conductivity of the bit line structures 90.

Figure 12:
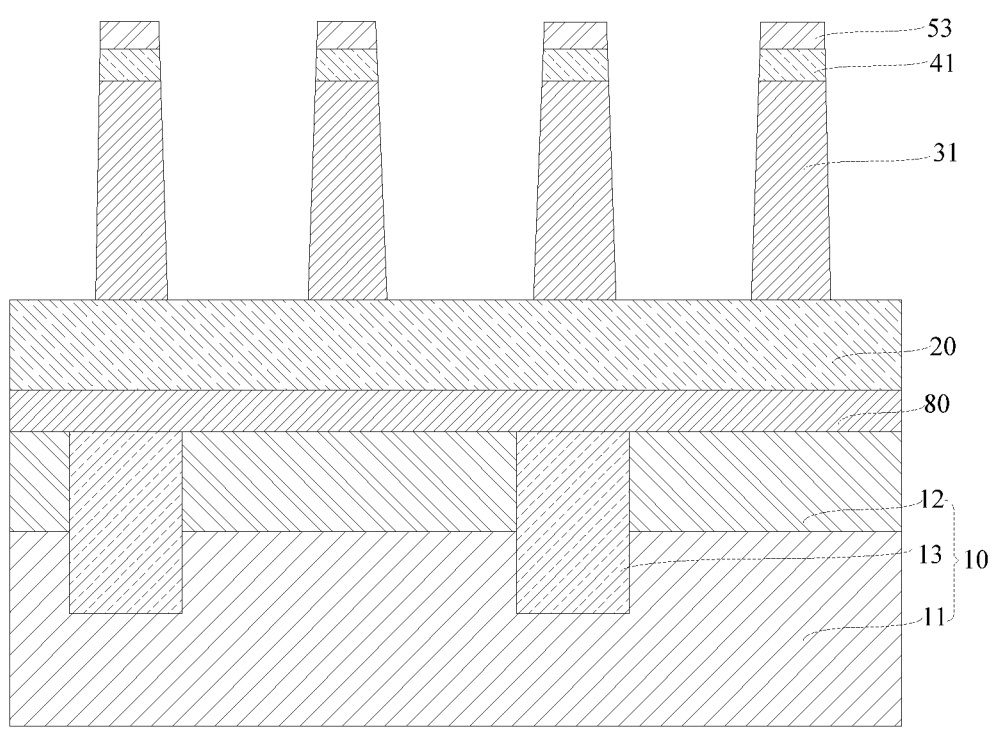
FIG. 12 is a schematic structural diagram with a first carbon layer removed in a method for manufacturing a semiconductor structure according to an embodiment of the application.

As shown in FIG. 12, the first carbon layer 51 located on the second polycrystalline silicon layer 53 is removed through an etching process.

Figure 13:
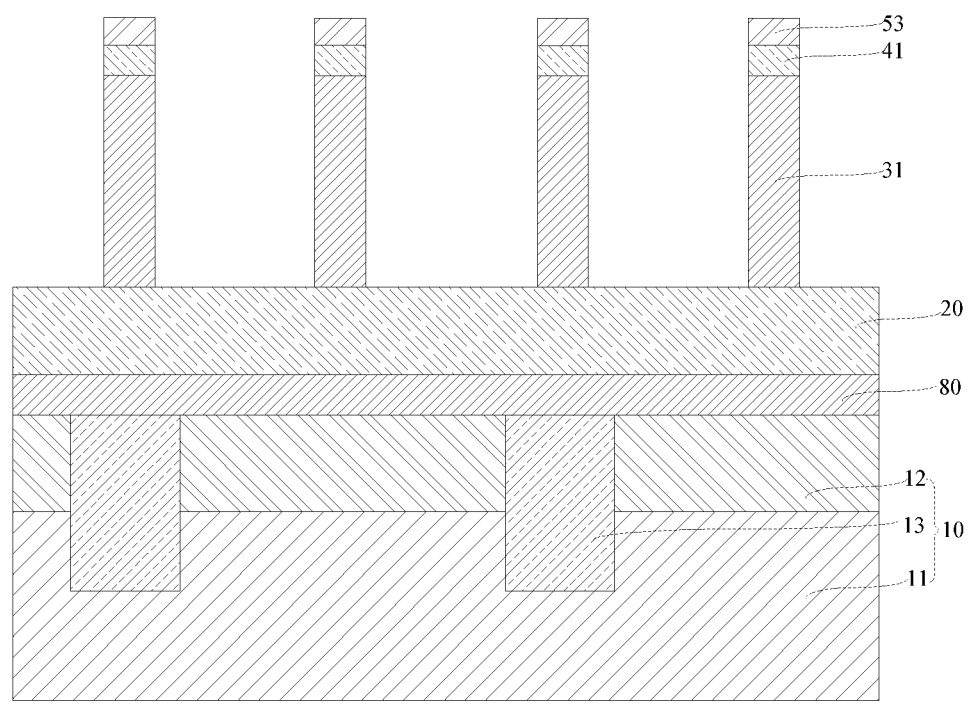
FIG. 13 is a schematic structural diagram with a first mask layer and a first dielectric layer corrected in a method for manufacturing a semiconductor structure according to an embodiment of the application.

As shown in FIG. 13, the first mask layer 41 with the trapezoidal structure and the first dielectric layer 31 with the trapezoidal structure are corrected, so as to form the first mask layer 41 with a rectangular structure and the first dielectric layer 31 with a rectangular structure. In this operation, the first mask layer 41 with the trapezoidal structure and the first dielectric layer 31 with the trapezoidal structure are slightly etched by utilizing any one or more gases of NF3, CF4 and SF6, so as to form the first mask layer 41 with the rectangular structure and the first dielectric layer 31 with the rectangular structure.

At last, part of the initial conductive layer 20 and part of the base 10 are etched by taking the first dielectric layer 31 with the rectangular structure as a mask, so as to form bit line structures. The initial conductive layer 20 may include conductive materials, such as metal tungsten, configured to realize the electric conductivity of the bit line structures 90.

The bit line structures 90 include first bit line structures 91 and second bit line structures 92 arranged alternatively. The first bit line structures 91 are electrically connected with the active areas. An end, close to the substrate 11, of the second bit line structure 92 is flush with an upper surface of the substrate 11.

In the embodiment, as part of the initial conductive layer 20 and part of the base 10 are etched by taking the first dielectric layer 31 with the rectangular structure as the mask, the key size of the formed bit line structure 90 is relatively small By doing so, the key size of the bit line structure 90 is reduced, which is benefit for the miniaturization of the semiconductor structure.

Figure 14:
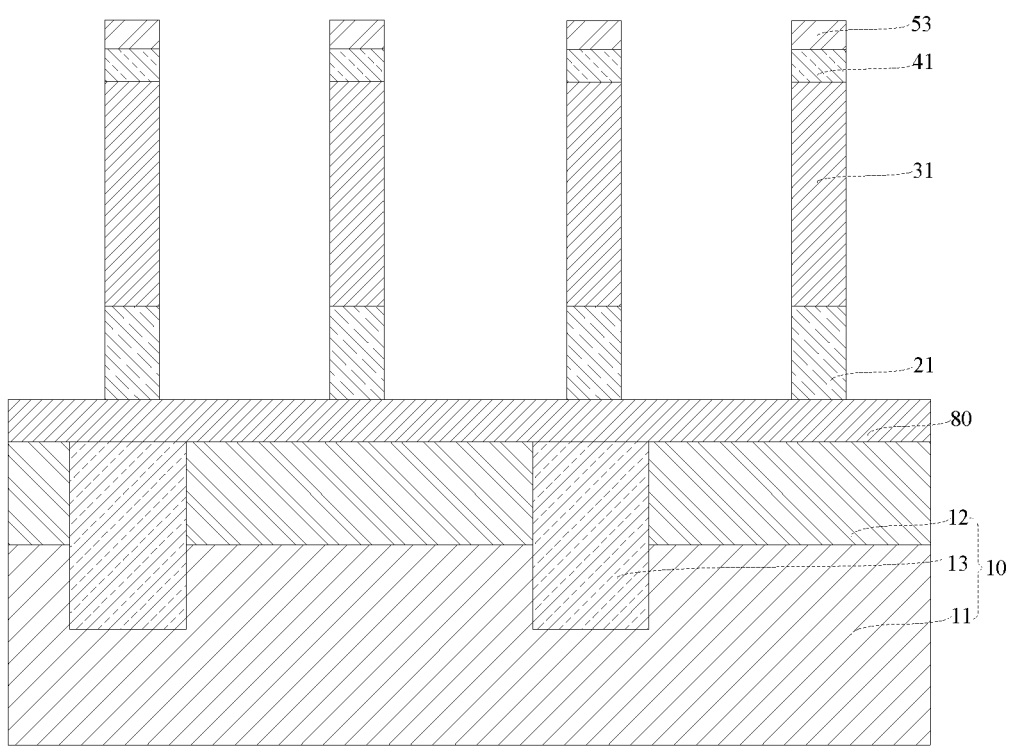
FIG. 14 is a schematic structural diagram with an initial conductive layer etched in a method for manufacturing a semiconductor structure according to an embodiment of the application.

Specifically, as shown in FIG. 14, part of the initial conductive layer 20 is etched by taking the first dielectric layer 31 with the rectangular structure as the mask, so as to form a conductive layer 21 with a pattern.

That is, the initial conductive layer 20, which is not shielded by the first dielectric layer 31, is etched away by utilizing an etching liquid or an etching gas, so that the initial conductive layer 20 forms the conductive layer 21 with the pattern.

Figure 15:
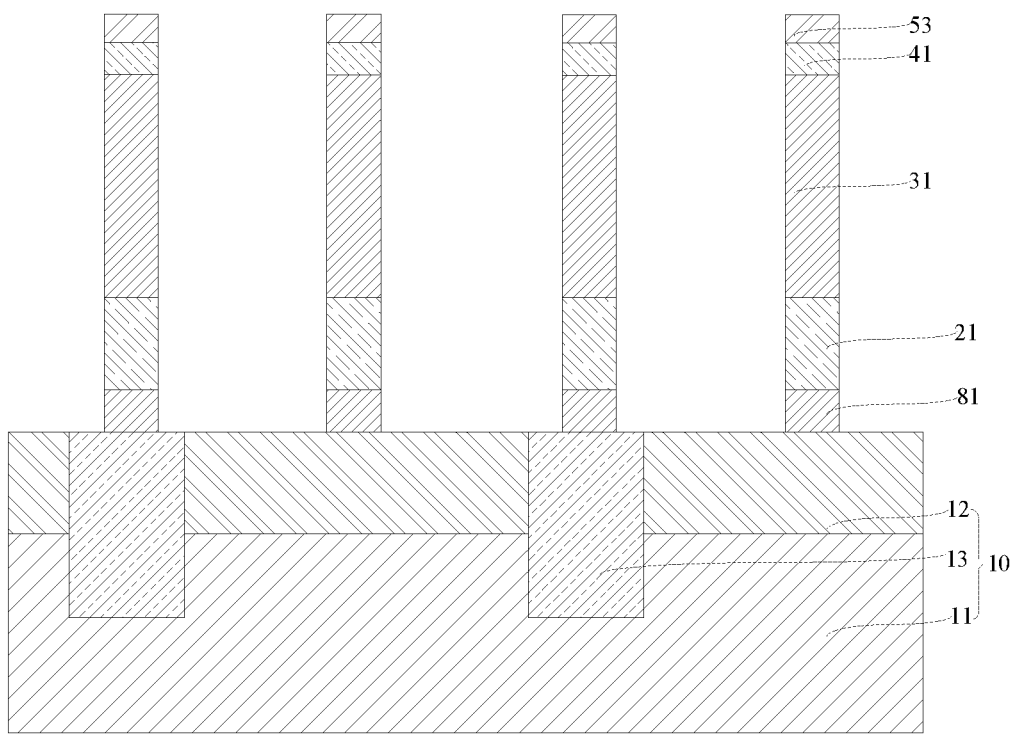
FIG. 15 is a schematic structural diagram with an initial bit line blocking layer etched in a method for manufacturing a semiconductor structure according to an embodiment of the application.

As shown in FIG. 15, part of the initial bit line blocking layer 80 is etched by taking the conductive layer 21 with the pattern as the mask, so as to form a bit line blocking layer 81 with a pattern.

Figure 16:
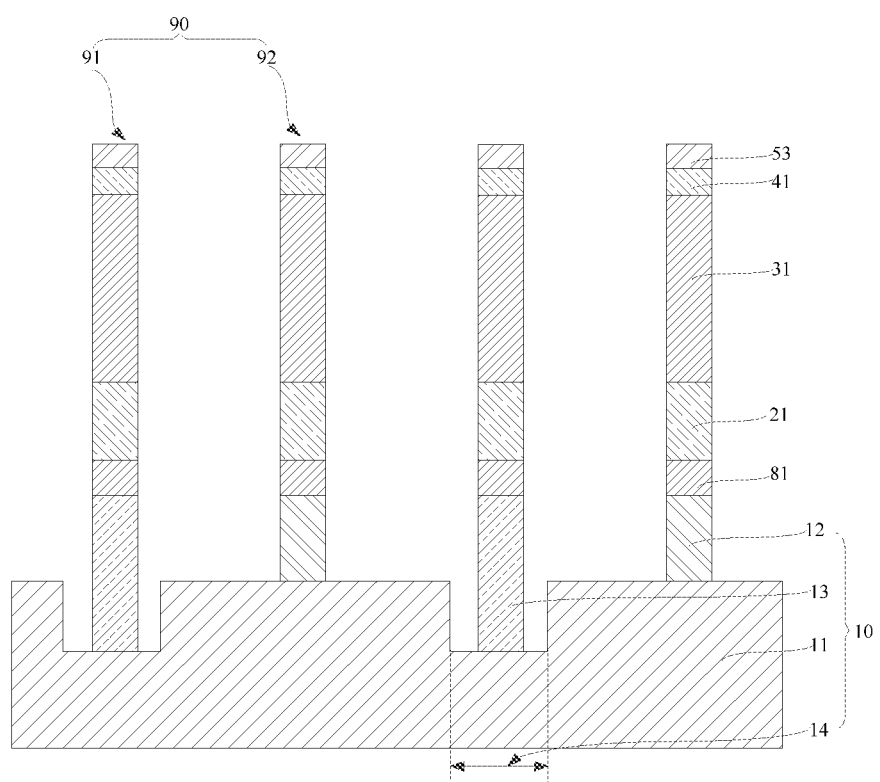
FIG. 16 is a schematic structural diagram with a base etched in a method for manufacturing a semiconductor structure according to an embodiment of the application.

As shown in FIG. 16, part of the first polycrystalline silicon layer 13 is etched by taking the conductive layer 21 with the pattern and the bit line blocking layer 81 with the pattern as a mask, so as to form first bit line structures 91. The first bit line structures 91 are electrically connected with the active areas 14.

Part of the insulating layer 12 is etched by taking the conductive layer 21 with the pattern and the bit line blocking layer 81 with the pattern as a mask, so as to form second bit line structures 92, and an end, close the substrate 11, of the second bit line structure 92 flush with to the upper surface of the substrate 11.

In the embodiment, there are multiple first bit line structures 91 and multiple second bit line structures 92. The first bit line structures 91 and the second bit line structures 92 are arranged alternatively. That is, one second bit line structure 92 is arranged between two adjacent first bit line structures 91.

According to the method for manufacturing the semiconductor structure and the semiconductor structure provided by the embodiments of the application, as the second dielectric layer forms the trapezoidal structure with small top and large bottom, the structural strength of the second dielectric layer is increased, the second dielectric layer is prevented from being inclined or bended in an etching process due to the thickness, so that the bit line structures are prevented from being inclined or bended in a process of forming the bit line structures by taking the second dielectric layer as the mask, and thus the yield of the semiconductor structure is improved.

Moreover, as the second polycrystalline silicon layer, the first mask layer and the first dielectric layer are corrected, the first mask layer and the first dielectric layer each have a rectangular structure. In comparison with the first mask layer and the first dielectric layer each having a trapezoidal structure, the key size of the formed bit line structure is reduced, which is benefit for the miniaturization of the semiconductor structure.

As shown in FIG. 16, the embodiments of the application further provide a semiconductor structure, which includes a base 10 and first bit line structures 91 and second bit line structures 92 arranged on the base 10. The first bit line structures 91 and the second bit line structures 92 extend into the base 10, and the first bit line structures 91 are configured to be electrically connected with the active areas 14 of the base 10.

The semiconductor structure is manufactured through the method for manufacturing the semiconductor structure provided by any of the above embodiments. As the second dielectric layer forms the trapezoidal structure with small top and large bottom, the structural strength of the second dielectric layer and the first mask layer are increased, the second dielectric layer is prevented from being inclined or bended in an etching process due to the thickness, so that the bit line structures are prevented from being inclined or bended in a process of forming the bit line structures by taking the second dielectric layer as the mask, and thus the yield of the semiconductor structure is improved.

Moreover, as the second polycrystalline silicon layer, the first mask layer and the first dielectric layer are corrected, the first mask layer and the first dielectric layer each have a rectangular structure. In comparison with the first mask layer and the first dielectric layer each having a trapezoidal structure, the key size of the formed bit line structure is reduced, which is benefit for the miniaturization of the semiconductor structure.

Various embodiments or implementation modes in the specification are described in a progressive way; each of the embodiments focuses on the differences from other embodiments. Same and similar parts among various embodiments may be referred to each other.

In descriptions of the specification, description of referring terms such as "one implementation mode", "some implementation modes", "a schematic implementation mode", "an example", "an specific example", or "some examples" refers to specific features, structures, materials or features described in combination with the implementation modes or demonstrations involved in at least one implementation mode or example of the application.

In the specification, schematic description on the above terms not always refers to same implementation modes or examples. Moreover, the described specific features, structures, materials or features may be combined in any one or more implementation modes or examples in a proper manner.

Finally, it is to be noted that the above various embodiments are only used to illustrate the technical solutions of the application, and are not limited thereto. Although the application has been described in detail with reference to the foregoing various embodiments, those of ordinary skill in the art should understand that the technical solutions described in the foregoing various embodiments still may be modified, or part or all technical features are equivalently replaced, but the modifications and replacements do not make the essence of the corresponding technical solutions depart from the scope of the technical solutions of various embodiments of the application.

The invention claimed is:

1. A method for manufacturing a semiconductor structure, comprising:
   providing a base;
   sequentially stacking an initial conductive layer, an initial first dielectric layer, an initial first mask layer, an initial second dielectric layer, an initial second mask layer and a photoresist layer with a pattern on the base;
   etching part of the initial second mask layer and part of the initial second dielectric layer by taking the photoresist layer as a mask, so as to form a second dielectric layer with a trapezoidal structure, a width of the trapezoidal structure being gradually increased from an end departing from the base to an end close to the base; and etching part of the initial first mask layer, part of the initial first dielectric layer, part of the initial conductive layer and part of the base by taking the second dielectric layer as a mask, so as to form bit line structures.

2. The method of claim 1, wherein the base comprises:
a substrate;
an insulating layer formed on the substrate; and
first polycrystalline silicon layers arranged in the insulating layer at intervals, the first polycrystalline silicon layers extending into the substrate.

3. The method of claim 2, before said sequentially stacking an initial conductive layer, an initial first dielectric layer, an initial first mask layer, an initial second dielectric layer, an initial second mask layer and a photoresist layer with a pattern on the base, further comprising:
forming an initial bit line blocking layer on the base, the initial bit line blocking layer being configured to block the initial conductive layer from permeating into the base.

4. The method of claim 3, wherein a material of the initial bit line blocking layer comprises titanium nitride.

5. The method of claim 3, wherein said sequentially stacking an initial conductive layer, an initial first dielectric layer, an initial first mask layer, an initial second dielectric layer, an initial second mask layer and a photoresist layer with a pattern on the base comprises:
sequentially stacking a second polycrystalline silicon layer, a first carbon layer and a second carbon layer on the initial first mask layer, wherein the second polycrystalline silicon layer, the first carbon layer and the second carbon layer form the initial second dielectric layer, and a concentration of silicon ions in the first carbon layer is higher than a concentration of silicon ions in the second carbon layer.

6. The method of claim 4, wherein said sequentially stacking an initial conductive layer, an initial first dielectric layer, an initial first mask layer, an initial second dielectric layer, an initial second mask layer and a photoresist layer with a pattern on the base comprises:
sequentially stacking a second polycrystalline silicon layer, a first carbon layer and a second carbon layer on the initial first mask layer, wherein the second polycrystalline silicon layer, the first carbon layer and the second carbon layer form the initial second dielectric layer, and a concentration of silicon ions in the first carbon layer is higher than a concentration of silicon ions in the second carbon layer.

7. The method of claim 5, wherein said sequentially stacking a second polycrystalline silicon layer, a first carbon layer and a second carbon layer on the initial first mask layer comprises:
forming an initial first carbon layer on the second polycrystalline silicon layer; and
doping silicon ions into the initial first carbon layer through an ion implantation technology, so as to form the first carbon layer.

8. The method of claim 7, wherein an etching selection ratio between the initial first mask layer and the second carbon layer is 1:15 to 1:9.

9. The method of claim 8, wherein said etching part of the initial second mask layer and part of the initial second dielectric layer by taking the photoresist layer as a mask, so as to form a second dielectric layer with a trapezoidal structure comprises:

etching part of the initial second mask layer by taking the photoresist layer as a mask, so as to form a second mask layer with a pattern; and
removing the photoresist layer, and etching part of the initial second dielectric layer by taking the second mask layer as a mask, so as to form the second dielectric layer with the trapezoidal structure.

10. The method of claim 9, wherein said etching part of the initial second dielectric layer by taking the second mask layer as a mask, so as to form the second dielectric layer with the trapezoidal structure comprises:
etching part of the second carbon layer and part of the first carbon layer by taking the second mask layer as the mask, so as to form the second carbon layer with a trapezoidal structure and the first carbon layer with a trapezoidal structure; and
etching part of the second polycrystalline silicon layer by taking the second carbon layer with the trapezoidal structure and the first carbon layer with the trapezoidal structure as a mask, so as to form the second polycrystalline silicon layer with the trapezoidal structure;
wherein the second carbon layer with the trapezoidal structure, the first carbon layer with the trapezoidal structure and the second polycrystalline silicon layer with the trapezoidal structure form the second dielectric layer with the trapezoidal structure.

11. The method of claim 10, after the second dielectric layer with the trapezoidal structure is formed, before said etching part of the initial first mask layer, part of the initial first dielectric layer, part of the initial conductive layer and part of the base by taking the second dielectric layer as a mask, further comprising:
removing the second mask layer and the second carbon layer; and
correcting the first carbon layer with the trapezoidal structure and the second polycrystalline silicon layer with the trapezoidal structure, so as to reduce a width of the first carbon layer and a width of the second polycrystalline silicon layer.

12. The method of claim 11, wherein said etching part of the initial first mask layer, part of the initial first dielectric layer, part of the initial conductive layer and part of the base by taking the second dielectric layer as a mask, so as to form bit line structures comprises:
etching part of the initial first mask layer by taking the corrected second polycrystalline silicon layer as a mask, so as to form a first mask layer with a trapezoidal structure;
etching part of the initial first dielectric layer by taking the first mask layer with the trapezoidal structure as a mask, so as to form a first dielectric layer with a trapezoidal structure;
removing the first carbon layer;
correcting the first mask layer with the trapezoidal structure and the first dielectric layer with the trapezoidal structure, so as to form the first mask layer with a rectangular structure and the first dielectric layer with a rectangular structure; and
etching part of the initial conductive layer and part of the base by taking the first dielectric layer with the rectangular structure as a mask, so as to form the bit line structures.

13. The method of claim 12, wherein the bit line structures comprise first bit line structures and second bit line structures which are arranged alternatively, the first bit line structures are electrically connected with active areas, and an end of the second bit line structure, close to the substrate, is flush with an upper surface of the substrate.

14. The method of claim 13, wherein said etching part of the initial conductive layer and part of the base by taking the first dielectric layer with the rectangular structure as a mask, so as to form the bit line structures comprises:
- etching part of the initial conductive layer by taking the first dielectric layer with the rectangular structure as a mask, so as to form a conductive layer with a pattern; and
- etching part of the initial bit line blocking layer by taking the conductive layer with the pattern as the mask, so as to form a bit line blocking layer with a pattern.

15. The method of claim 14, after the conductive layer with the pattern and the bit line blocking layer with the pattern are formed, further comprising:
- etching part of the first polycrystalline silicon layer by taking the conductive layer with the pattern and the bit line blocking layer with the pattern as a mask, so as to form the first bit line structures; and
- etching part of the insulating layer by taking the conductive layer with the pattern and the bit line blocking layer with the pattern as a mask, so as to form the second bit line structures.

\* \* \* \* \*